US009281182B2

(12) United States Patent
Kim et al.

(10) Patent No.: US 9,281,182 B2
(45) Date of Patent: Mar. 8, 2016

(54) PRE-CUT WAFER APPLIED UNDERFILL FILM (71) Applicant: HENKEL IP & HOLDING GMBH, Duesseldorf (DE)

(72) Inventors: YounSang Kim, Irvine, CA (US); Gina Hoang, Garden Grove, CA (US); Rose Guino, Irvine, CA (US)

(73) Assignee: HENKEL IP & HOLDING GMBH, Duesseldorf (DE)

( * ) Notice: Subject to any disclaimer, the term of this patent is extended or adjusted under 35 U.S.C. 154(b) by 0 days.

(21) Appl. No.: 13/800,862

(22) Filed: Mar. 13, 2013

(65) Prior Publication Data
US 2013/0210239 A1 Aug. 15, 2013

Related U.S. Application Data (63) Continuation of application No. PCT/US2012/022853, filed on Jan. 27, 2012.

(60) Provisional application No. 61/438,327, filed on Feb. 1, 2011.

(51) Int. Cl.
*H01L 21/02* (2006.01)
*H01L 21/56* (2006.01)
(Continued)

(52) U.S. Cl.
CPC ........ *H01L 21/02227* (2013.01); *H01L 21/563* (2013.01); *H01L 21/6836* (2013.01); *H01L 23/481* (2013.01); *H01L 2221/6834* (2013.01); *H01L 2221/68327* (2013.01);
(Continued)

(58) Field of Classification Search
CPC .................................................... H01L 51/0097
USPC .................................................. 438/118, 759
See application file for complete search history.

(56) References Cited

U.S. PATENT DOCUMENTS 4,208,005 A   6/1980  Nate et al.
5,045,921 A * 9/1991  Lin et al. ....................... 257/680
(Continued)

FOREIGN PATENT DOCUMENTS

CN      101339910 A    1/2009
EP         1381076 A2 *  1/2004   .............. H01L 21/00
(Continued)

OTHER PUBLICATIONS

RC-800 Series, Pulsed UV Curing Systems. Brochure, Xenon Corporation, 2006, Wilmington, MA, USA.
(Continued)

*Primary Examiner* — Jarrett Stark
*Assistant Examiner* — Charles N Ausar-El
(74) *Attorney, Agent, or Firm* — James J. Cummings (57) ABSTRACT

A method for preparing a semiconductor with preapplied underfill comprises providing a semiconductor wafer with a plurality of metallic bumps on its top side and, optionally, through-silica-vias vertically through the silicon wafer; laminating a back grinding tape to the top of the wafer covering the metallic bumps and through silicon vias; thinning the back side of the wafer; mounting a dicing tape to the back side of the thinned wafer and mounting the silicon wafer and dicing tape to a dicing frame; removing the back grinding tape; providing an underfill material precut into the shape of the wafer; aligning the underfill on with the wafer and laminating the underfill to the wafer.

12 Claims, 8 Drawing Sheets

Inventive Method

Inventive Method (51) Int. Cl.
*H01L 21/683* (2006.01)
*H01L 23/48* (2006.01)

(52) U.S. Cl.
CPC .......... *H01L 2221/68377* (2013.01); *H01L 2224/73104* (2013.01); *H01L 2224/83191* (2013.01)

(56) References Cited

U.S. PATENT DOCUMENTS

| | | | |
|---|---|---|---|
| 5,356,947 A | 10/1994 | Ali et al. | |
| 5,635,010 A | 6/1997 | Pepe et al. | |
| 5,681,757 A | 10/1997 | Hayes | |
| 6,260,264 B1 | 7/2001 | Chen et al. | |
| 6,465,330 B1 * | 10/2002 | Takahashi et al. | 438/464 |
| 6,534,387 B1 | 3/2003 | Shinogi et al. | |
| 6,794,751 B2 | 9/2004 | Kumamoto | 257/738 |
| 6,958,298 B2 | 10/2005 | Murayama | |
| 7,071,572 B2 * | 7/2006 | Kumamoto | 257/778 |
| 7,074,695 B2 | 7/2006 | Park et al. | |
| 7,176,044 B2 | 2/2007 | Forray et al. | |
| 7,312,534 B2 * | 12/2007 | delos Santos | C09J 5/06 257/783 |
| 7,455,095 B2 | 11/2008 | Yamamoto | |
| 7,468,292 B2 | 12/2008 | Yamano | |
| 7,473,617 B2 | 1/2009 | Momoi et al. | |
| 7,482,251 B1 | 1/2009 | Paulsen et al. | |
| 7,488,993 B2 | 2/2009 | Takano et al. | |
| 7,491,772 B2 | 2/2009 | Kamiya et al. | |
| 7,494,845 B2 | 2/2009 | Hwang et al. | |
| 7,494,900 B2 | 2/2009 | Harris et al. | |
| 7,495,315 B2 | 2/2009 | Lee et al. | |
| 7,498,520 B2 | 3/2009 | Osaka et al. | |
| 7,501,300 B2 | 3/2009 | Abe | |
| 7,560,519 B2 | 7/2009 | Canelas et al. | |
| 7,727,875 B2 | 6/2010 | Shin et al. | |
| 7,811,903 B2 | 10/2010 | Grigg et al. | |
| 8,106,522 B2 | 1/2012 | Sato et al. | |
| 8,648,476 B2 | 2/2014 | Takamoto et al. | |
| 8,692,389 B2 | 4/2014 | Takamoto et al. | |
| 8,703,584 B2 | 4/2014 | Misumi et al. | |
| 8,704,366 B2 | 4/2014 | Shin et al. | |
| 2001/0040298 A1 * | 11/2001 | Baba et al. | 257/778 |
| 2002/0166625 A1 | 11/2002 | Ball et al. | |
| 2002/0197771 A1 | 12/2002 | Dotta et al. | |
| 2003/0017663 A1 | 1/2003 | Takyu et al. | |
| 2003/0022465 A1 | 1/2003 | Wachtler | |
| 2003/0129438 A1 | 7/2003 | Becker et al. | |
| 2004/0185601 A1 | 9/2004 | Stepniak et al. | |
| 2004/0266940 A1 | 12/2004 | Issari | |
| 2005/0003636 A1 | 1/2005 | Takyu et al. | |
| 2005/0014313 A1 | 1/2005 | Workman et al. | |
| 2005/0074547 A1 * | 4/2005 | Morganelli et al. | 427/58 |
| 2005/0126686 A1 | 6/2005 | Cheong et al. | |
| 2005/0181540 A1 | 8/2005 | Farnworth et al. | |
| 2005/0260829 A1 | 11/2005 | Uematsu et al. | |
| 2006/0046433 A1 | 3/2006 | Sterrett et al. | |
| 2006/0177954 A1 * | 8/2006 | Jeong et al. | 438/33 |
| 2006/0205182 A1 | 9/2006 | Soejima | |
| 2007/0000595 A1 * | 1/2007 | Prack | 156/154 |
| 2007/0087532 A1 | 4/2007 | Bauer et al. | |
| 2007/0137782 A1 | 6/2007 | Matsumura et al. | |
| 2007/0155047 A1 | 7/2007 | Jayaraman et al. | |
| 2007/0241436 A1 | 10/2007 | Ookubo et al. | |
| 2007/0259515 A1 | 11/2007 | Paik et al. | |
| 2008/0003719 A1 | 1/2008 | Lu et al. | |
| 2008/0027199 A1 | 1/2008 | Mazurek et al. | |
| 2008/0064188 A1 | 3/2008 | Hayashi | |
| 2008/0157303 A1 | 7/2008 | Yang | |
| 2008/0176167 A1 | 7/2008 | Kawamori et al. | |
| 2008/0220591 A1 | 9/2008 | Nakamura | |
| 2008/0280422 A1 | 11/2008 | Shin et al. | |
| 2009/0075429 A1 | 3/2009 | Sato et al. | |
| 2009/0166863 A1 * | 7/2009 | Watanabe et al. | 257/738 |
| 2010/0047969 A1 * | 2/2010 | Kim et al. | 438/113 |
| 2010/0081235 A1 | 4/2010 | Furumura | |
| 2010/0190293 A1 | 7/2010 | Maeda et al. | |
| 2011/0198721 A1 | 8/2011 | Yang et al. | |
| 2012/0049304 A1 | 3/2012 | Motz et al. | |
| 2012/0244655 A1 * | 9/2012 | Moore et al. | 438/57 |

FOREIGN PATENT DOCUMENTS

| | | |
|---|---|---|
| EP | 2192611 A1 | 6/2010 |
| JP | 03039378 A | 2/1991 |
| JP | 2000299333 A | 10/2000 |
| JP | 2001176822 A | 6/2001 |
| JP | 2005320491 A | 11/2005 |
| JP | 2007016074 A | 1/2007 |
| JP | 2007100065 A | 4/2007 |
| JP | 2007158212 A1 | 6/2007 |
| JP | 2008294382 A | 12/2008 |
| JP | 2009164476 A | 7/2009 |
| KR | 20020023105 A | 3/2002 |
| KR | 100379563 B1 | 4/2003 |
| WO | 8400506 A1 | 2/1984 |
| WO | 2008094149 A1 | 8/2008 |
| WO | 2011128319 A1 | 10/2011 |

OTHER PUBLICATIONS

"If you have a problem with mercury UV curing, we have a better solution. Pulsed UV Light." Brochure, Xenon Corporation, 2006, Wilimington, MA, USA.

* cited by examiner

Figure 1a. Prior Art Method

Figure 1b. Prior Art Method

Figure 2b. Prior Art Method

Figure 3a. Prior Art Method

Figure 3b. Prior Art Method

Figure 4b. Inventive Method

PRE-CUT WAFER APPLIED UNDERFILL FILM

BACKGROUND OF THE INVENTION

This invention relates to a process for the fabrication of a semiconductor die.

Miniaturization and slimming of electrical and electronic equipment has led to a need for both thinner semiconductor devices and thinner semiconductor packaging. One way to produce a thinner semiconductor die is to remove excess material from the back side (inactive side) of the die. This is more easily done by removing excess material from the back side of the semiconductor wafer from which the individual dies are diced. The removal of the excess wafer typically occurs in a grinding process, commonly called back side grinding.

One way to produce smaller and more efficient semiconductor packages is to utilize a package having an array of metallic bumps attached to the active face of the package. The metallic bumps are disposed to match with bonding pads on a substrate. When the metal is reflowed to a melt, it connects with the bonding pads forming both electrical and mechanical connections. This metallic bump packaging is generally referred to as "flip chip" because the bumped semiconductors are flipped to be attached to their substrates.

A thermal mismatch exists between the semiconductor and the substrate, so that with repeated thermal cycling the metallic interconnections are stressed, potentially leading to failure. To counteract this, an encapsulating material, commonly called an underfill, is disposed in the gap surrounding the metallic bumps, between the semiconductor and the substrate.

Current trends in semiconductor packaging fabrication favor completing as many process steps as possible at the wafer level, allowing multiple integrated circuits to be processed at the same time, rather than individually, as occurs after die singulation. Unfortunately, underfill application does not lend itself well to wafer level processing, particularly when the wafer is thinned down in a grinding step, as handling becomes even more difficult due to the fragility of the thinned wafer.

Thus, there exists a need for a method of applying a wafer level underfill material to a thinned wafer that does not compromise the fragility of the wafer.

SUMMARY OF THE INVENTION

This invention is a method for producing a thinned semiconductor wafer with applied underfill comprising: (a) providing a semiconductor wafer with a plurality of metallic bumps on its top side and, optionally, through-silica-vias vertically through the silicon wafer; (b) laminating a back grinding tape to the top of the wafer covering the metallic bumps and through silicon vias; (c) thinning the back side of the wafer; (d) mounting a dicing tape to the back side of the thinned wafer and mounting the silicon wafer and dicing tape to a dicing frame; (e) removing the back grinding tape; (f) providing an underfill material precut into the shape of the wafer; (g) aligning the underfill with the wafer and laminating the underfill to the wafer.

DETAILED DESCRIPTION OF THE INVENTION

The wafer is a semiconductor material, typically silicon, gallium arsenide, germanium, or similar compound semiconductor materials. The formation of the plurality of metallic bumps on the top side of the wafer, and their metallic composition, are made according to semiconductor and metallic fabrication methods well documented in industry literature.

Silicon-through-vias are vertical passageways extending completely through the silicon wafer for the purpose of connecting circuitry from one wafer to another wafer.

The purpose of the dicing tape used in the inventive method is to support the wafer during dicing operations. Dicing tapes are commercially available from a number of sources and in one form consist of a heat sensitive, pressure sensitive, or UV sensitive adhesive on a carrier. The carrier is typically a flexible substrate of polyolefin or polyimide. When heat, pulling strain, or UV is applied respectively, the adhesiveness decreases. Commonly, a release liner covers the adhesive layer and can be easily removed just prior to use of the dicing tape.

The purpose of the back grinding tape is to protect and support the metallic bumps and top surface of the wafer during the wafer thinning process. Back grinding tapes are commercially available from a number of sources and in one form consist of a heat sensitive, pressure sensitive, or UV sensitive adhesive on a carrier. The carrier is typically a flexible substrate of polyolefin or polyimide. When heat, pulling strain, or UV is applied respectively, the adhesiveness decreases. Commonly, a release liner covers the adhesive layer and can be easily removed just prior to use of the back grinding tape. The back grinding operation may be performed by mechanical grinding, laser grinding, or etching.

Adhesives and encapsulants suitable as underfill chemistry that can be in the form of films are known, as are methods for making the underfill films. The thickness of the underfill material can be adjusted so that the metallic bumps can be either completely or only partially covered after lamination. In either case, the underfill material is supplied so that it fully fills the space between the semiconductor and the intended substrate. In one embodiment, the underfill material is provided on a carrier and is protected with a release liner. Thus, the underfill material will be provided in a three layer form in which the first layer is a carrier, such as a flexible polyolefin or polyimide tape, the second layer is the underfill material, and the third layer is a release liner, in that order. Just before use, the release liner is removed and the underfill is typically applied when still attached to the carrier. After application of the underfill to the wafer, the carrier is removed.

The invention is further described by reference to the Figures. In the figures, assemblies of one or more elements of dicing tape, silicon wafer, metallic bumps, underfill, and back grinding tape can be shown with the active face of the silicon wafer (the face containing the metallic bumps) oriented up or down. The assembly can be handled in any orientation determined by the practitioner. Each of the dicing tape, back grinding tape, and underfill are shown without release liner. The dicing tape and back grinding tape are provided on a carrier and are discarded after use. It will be understood by those skilled in the art that a release liner is generally used to protect the pressure sensitive adhesive of the dicing tape or back grinding tape, and that the release liner is removed just prior to use. The underfill layer laminated onto the active side of the wafer will move on to the dicing and bonding steps.

Figure 1A:
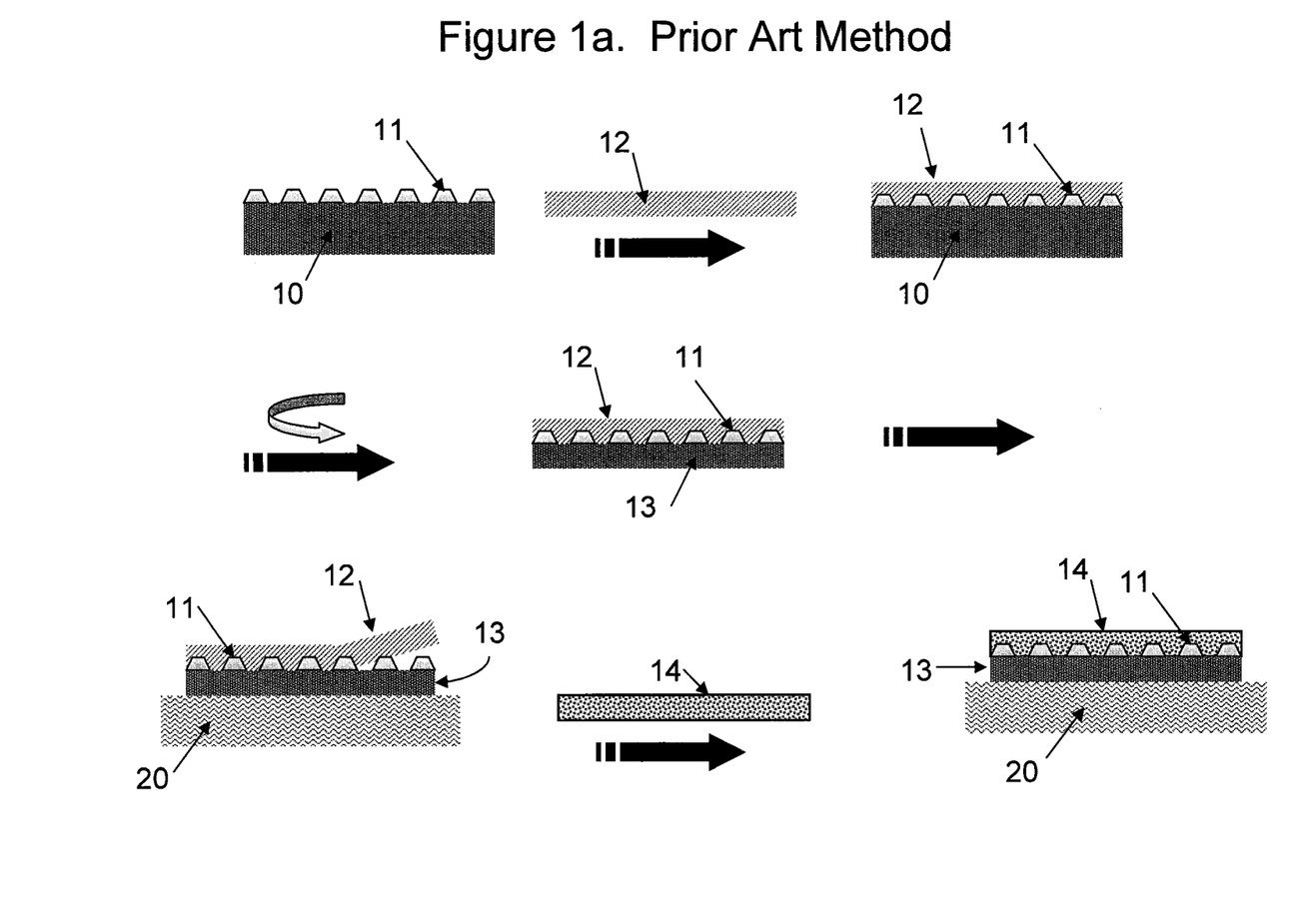
FIGS. 1a and 1b depict in series a first prior art scheme for preparing a thinned silicon wafer with metallic bumps supported by underfill.
Figure 1B:
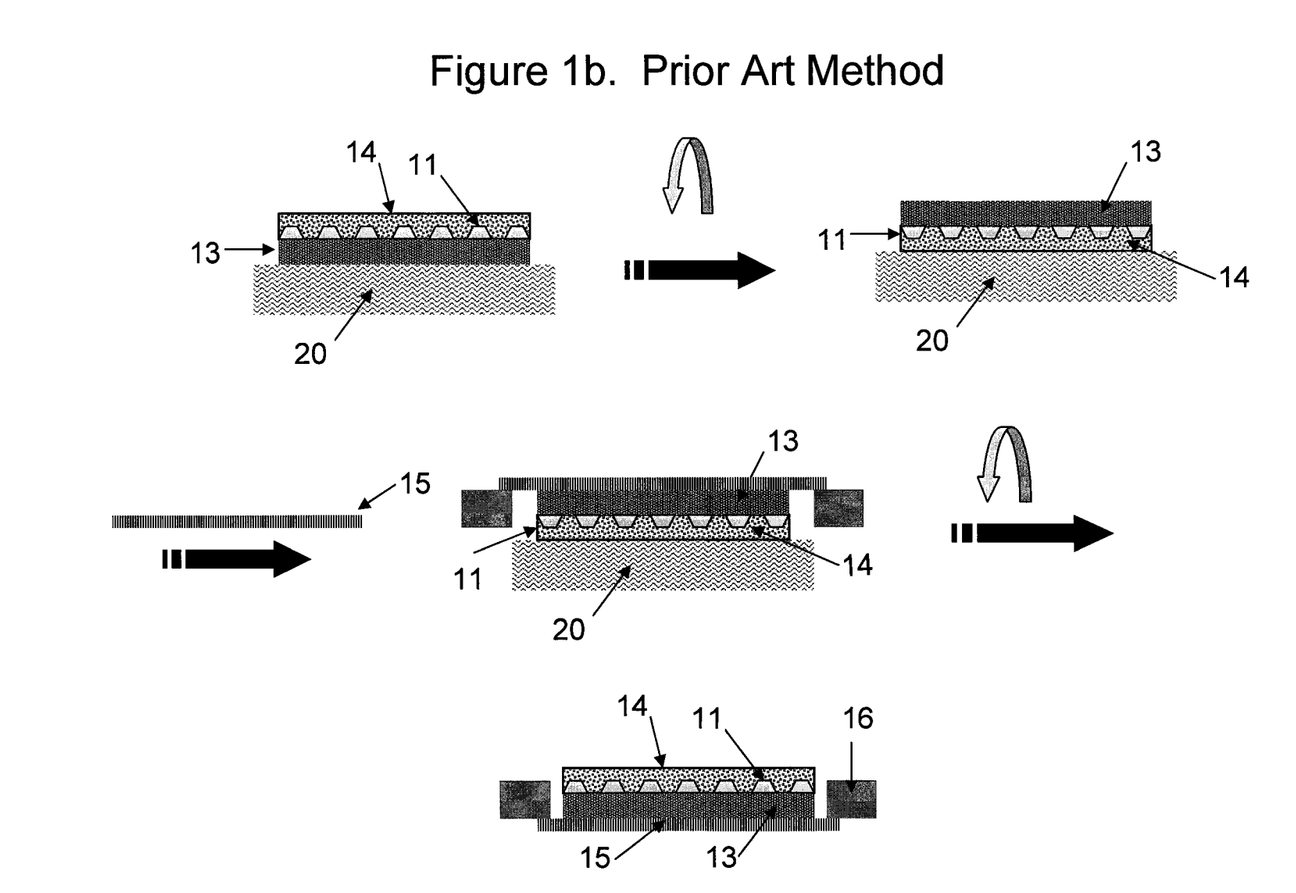

FIGS. 1a and 1b depict a first prior art scheme for preparing a thinned silicon wafer with metallic bumps supported by underfill. Silicon wafer 10 with metallic bumps 11 on one face (active face) of the silicon wafer is prepared. The metallic bumps 11 are covered with a tape 12 to protect the active face of the wafer during the thinning of the wafer. The tape is commonly called a back grinding tape. The back side of the wafer is thinned to produce a thinned wafer 13. The thinned wafer 13 with back grinding tape 12 is placed on a vacuum chuck table 17 as the back grinding tape is removed. An underfill material 14 is laminated over the active face of the wafer, surrounding and encapsulating the metallic bumps 11. A dicing tape 15 is mounted on the thinned back side of the wafer, and the wafer is then placed in a dicing frame (or jig) 16 for subsequent dicing into individual semiconductors. The disadvantage of this method is that after the back grinding tape is removed the wafer is fragile and is left unsupported until it is laminated onto the dicing tape and placed in the dicing frame.

Figure 2A:
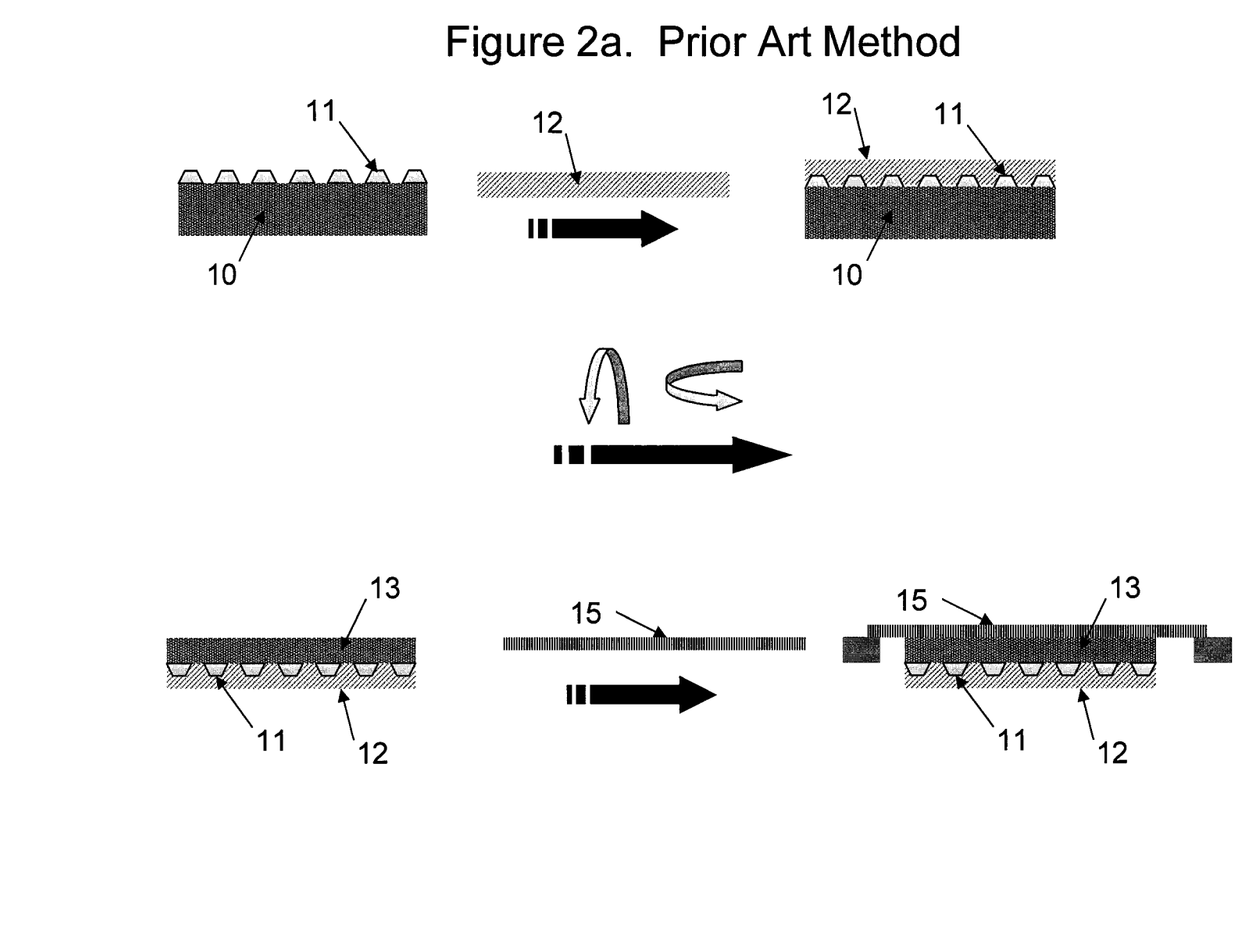
FIGS. 2a and 2b depict in series a second prior art scheme for preparing a thinned silicon wafer with metallic bumps supported by underfill.
Figure 2B:
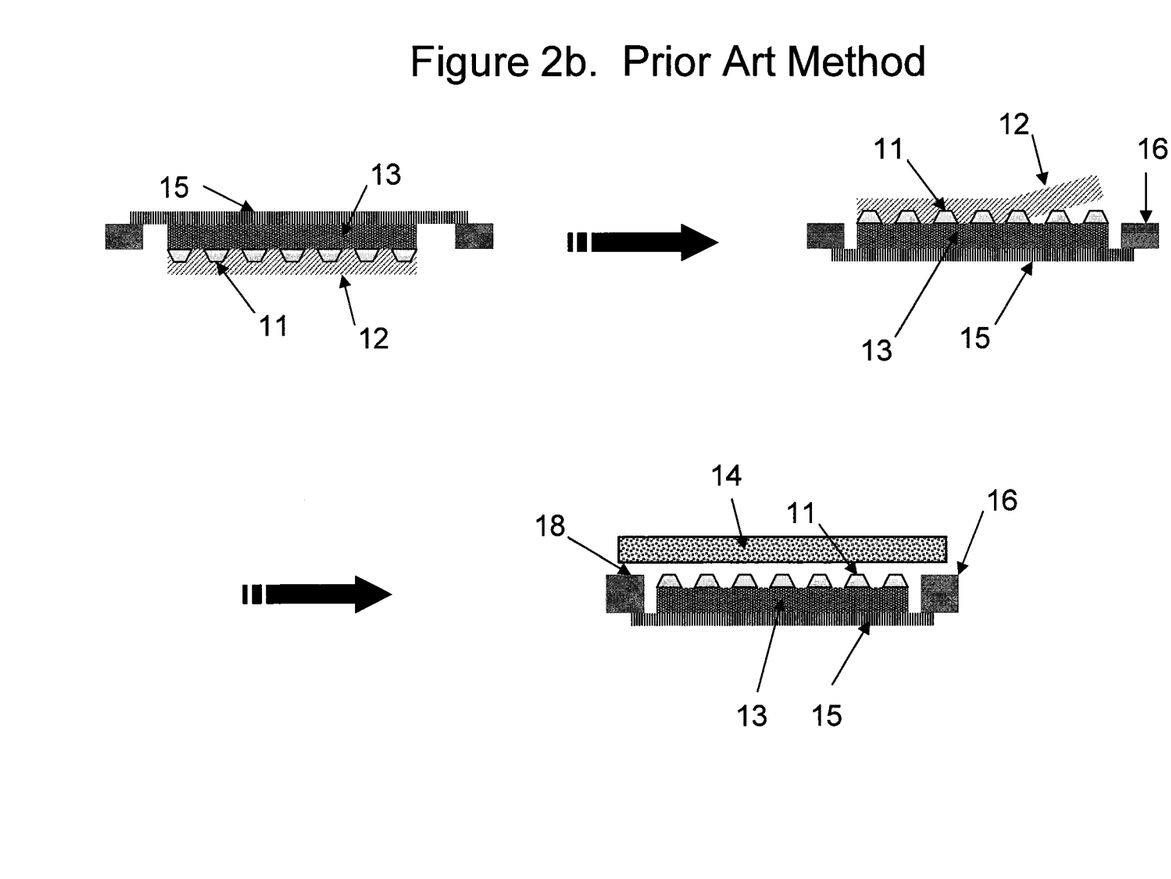

FIGS. 2a and 2b depict a second prior art scheme for preparing a thinned silicon wafer with metallic bumps supported by underfill. Silicon wafer 10 with metallic bumps 11 on one face (active face) of the silicon wafer is prepared. The metallic bumps 11 are covered with a protective back grinding tape 12. The back side of the wafer is thinned to produce a thinned wafer 13. A dicing tape 15 is mounted on the back side of the wafer, and the wafer placed in a dicing frame 16 on a vacuum chuck table 20. An underfill material 14 is laminated over the active face of the wafer, surrounding and encapsulating the metallic bumps 11. The disadvantage of this method is that the underfill material contacts the dicing frame at interface 18 causing wrinkling in the underfill during lamination.

Figure 3A:
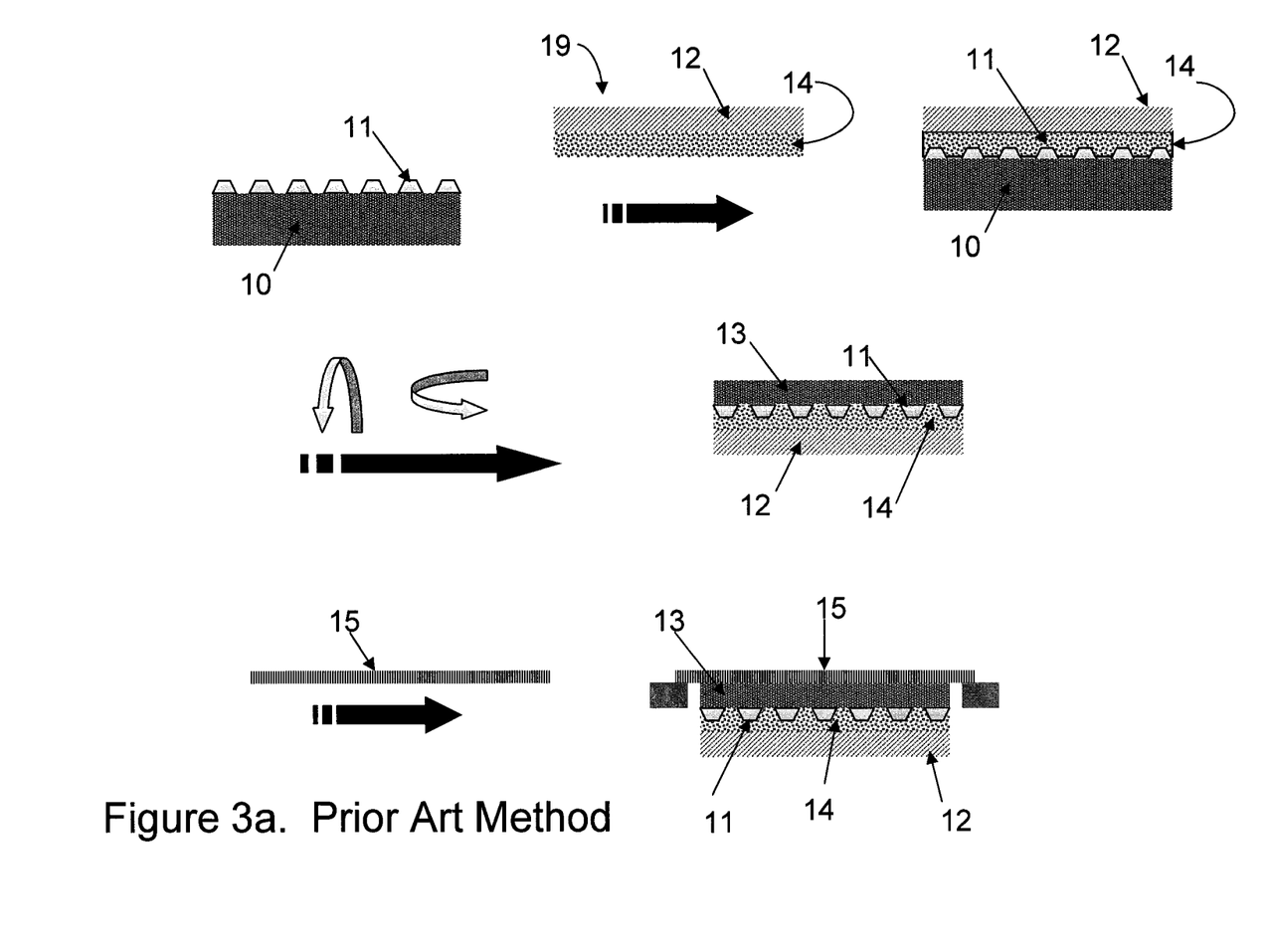
FIGS. 3a and 3b depict in series a third prior art scheme for preparing a thinned silicon wafer with metallic bumps supported by underfill.
Figure 3B:
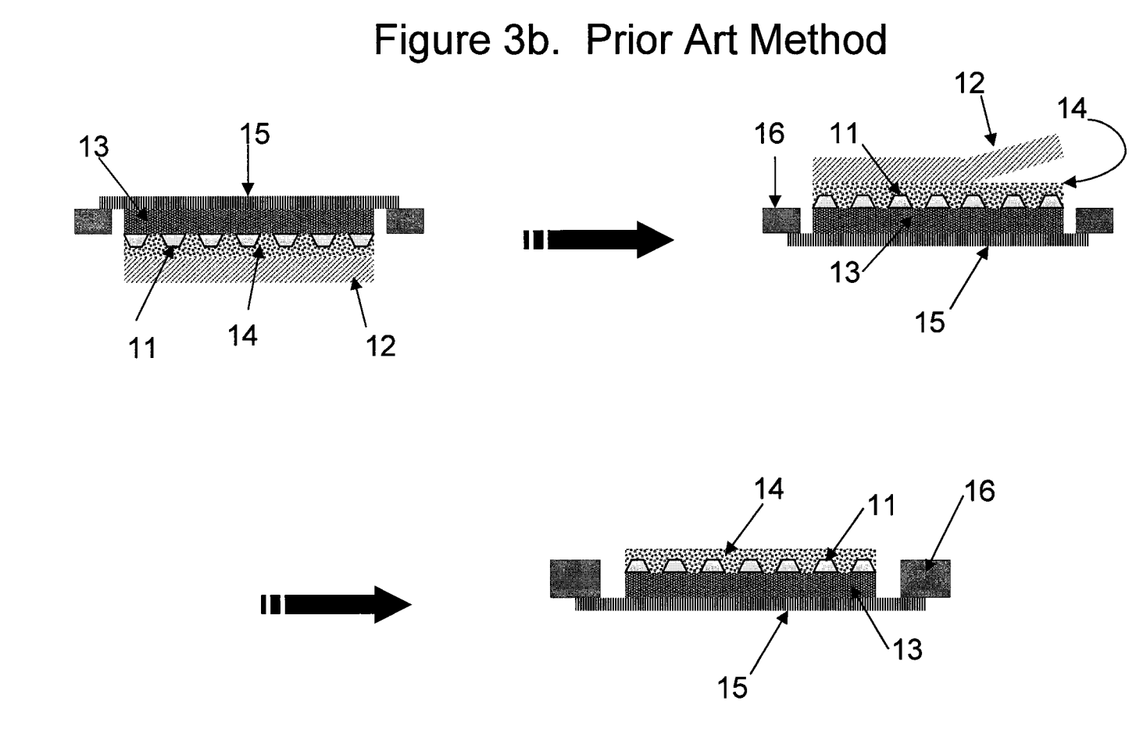

FIGS. 3a and 3b depict a third prior art scheme for preparing a thinned silicon wafer with metallic bumps supported by underfill. Silicon wafer 10 with metallic bumps 11 on one face (active face) of the silicon wafer is prepared. A two layer tape 19, in which one layer is a protective back grinding tape 12 and the second layer is an underfill material 14, is disposed on the active face of the silicon wafer with the underfill layer in contact with, and covering, the metallic bumps 11. The back side of the wafer is thinned to produce a thinned wafer 13. A dicing tape 15 is mounted on the back side of the wafer, and the wafer placed in a dicing frame 16 on a vacuum chuck table 20. The back grinding tape layer 12, of the two layer tape 19, is removed, leaving the underfill material 14. The disadvantage of this method is the interaction between the back grinding tape and the underfill material. The adhesion of the back grinding tape to the underfill layer can be stronger than the adhesion of the underfill layer to the wafer. This can cause the underfill layer to be peeled off from the wafer during the removal of the back grinding tape. In addition, uniform thinning of the wafer can be affected by variations in the thickness of the back grinding tape. When the variation in thickness of the underfill is added to the variation in thickness of the back grinding tape, the total variation in thickness increases and has an even greater deleterious affect on the uniformity of the wafer thickness after thinning.

Figure 4A:
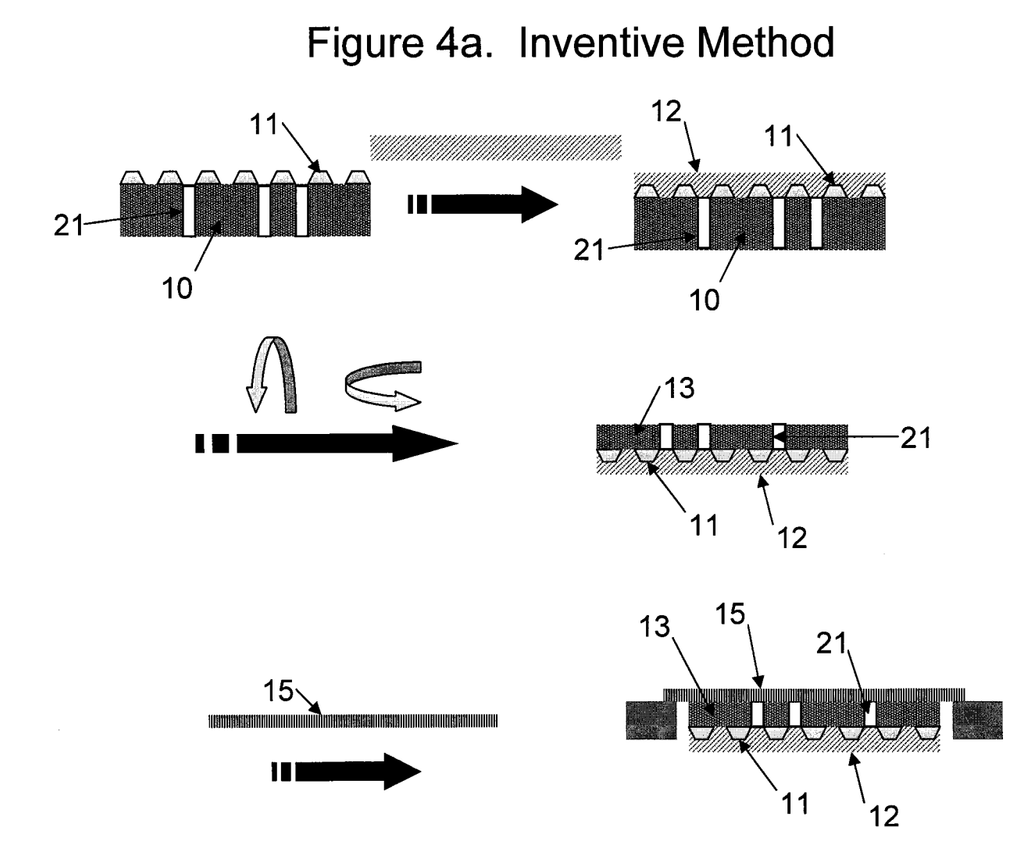
FIGS. 4a and 4b depict in series the inventive scheme for preparing a thinned silicon wafer with metallic bumps supported by underfill.
Figure 4B:
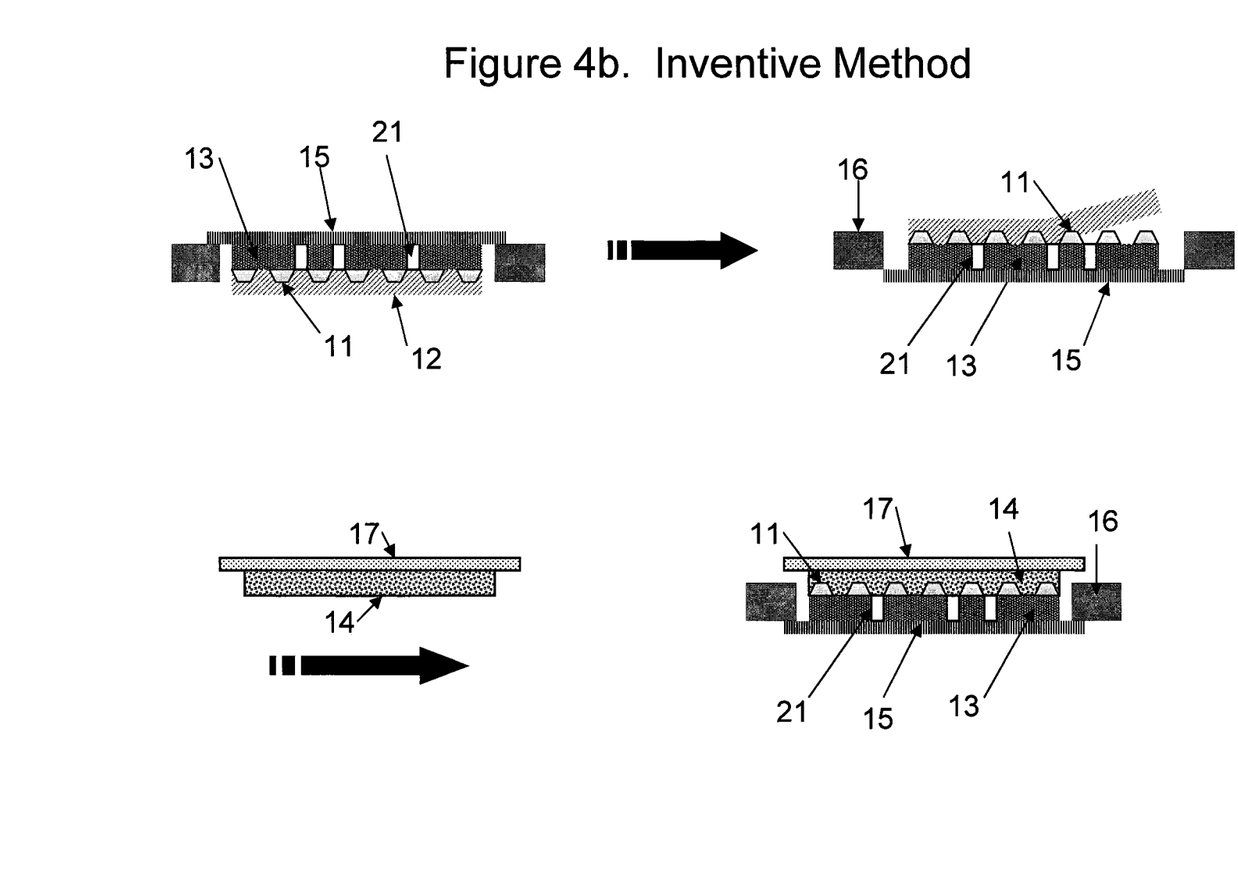

FIGS. 4a and 4b depict the inventive method: A thick silicon wafer 10 having a plurality of metallic bumps 11 and optional through-silica-vias 21 is prepared. A protective back grinding tape 12 is laminated over the metallic bumps and the top surface of the silicon wafer. A dicing tape 15 to support the thinned wafer during subsequent dicing is mounted to the back side of the thinned wafer. The wafer 13 with dicing tape 15 and back grinding tape 12 is mounted into a dicing frame 16 with the top side of the wafer facing up and the dicing tape in contact with the dicing frame. The back grinding tape is removed. A carrier tape 17 with underfill material 14 on one side is provided. The underfill material 14 is precut to fit the top surface of the wafer. The underfill is contacted with the wafer, aligning shapes, and laminated to the active face of the wafer (with metallic bumps) with the carrier still intact. The carrier is removed before further processing.

Thus, in one embodiment, this invention is a method for producing a thinned semiconductor wafer with applied underfill comprising: (a) providing a semiconductor wafer with a plurality of metallic bumps on its top side and, optionally, through-silica-vias vertically through the silicon wafer; (b) laminating a back grinding tape to the top of the wafer covering the metallic bumps and through silicon vias; (c) thinning the back side of the wafer; (d) mounting a dicing tape to the back side of the thinned wafer and mounting the silicon wafer and dicing tape to a dicing frame; (e) removing the back grinding tape; (f) providing an underfill material precut into the shape of the wafer; (g) aligning the underfill with the wafer and laminating the underfill to the wafer.

There are two primary advantages of this method: (i) the thinned wafer is supported by the back grinding tape or dicing tape, or both, throughout the fabrication steps, and (ii) because the underfill is precut to the shape of the wafer, no underfill hits the dicing frame, eliminating any possibility of wrinkling or creating voids during lamination of the underfill to the wafer.

What is claimed:

1. A method for producing a thinned semiconductor wafer with applied underfill, said method consisting of:
   (a) providing a semiconductor wafer with a plurality of metallic bumps on its top side and, optionally, through-silica-vias vertically through the silicon wafer;
   (b) laminating a back grinding tape to the top of the wafer covering the metallic bumps and the through silicon vias, if present, wherein the backgrinding tape is disposed in contact with the metallic bumps;
   (c) thinning the back side of the wafer to form a thinned wafer;
   (d) mounting a dicing tape to the back side of the thinned wafer and mounting the silicon wafer and dicing tape to a dicing frame;
   (e) removing the back grinding tape;
   (f) providing an underfill material precut into the shape of the thinned wafer;
   (g) aligning the underfill with the thinned wafer and laminating the underfill to the thinned wafer;
   wherein prior to (g), no underfill is disposed in between the metallic bumps.

2. The method of claim 1 wherein said semiconductor wafer is silicon.

3. The method of claim 1 wherein said semiconductor wafer does not contain through-silica-vias.

4. The method of claim 1 wherein said semiconductor wafer does contain through-silica-vias.

5. The method of claim 1 wherein said back grinding tape comprises a heat sensitive adhesive, a pressure sensitive adhesive or a UV sensitive adhesive on a flexible substrate selected from a polyolefin or a polyimide.

6. The method of claim 1 wherein said dicing tape comprises a heat sensitive adhesive, a pressure sensitive adhesive or a UV sensitive adhesive on a flexible substrate selected from a polyolefin or a polyimide.

7. The method of claim 1 wherein said underfill material is provided in a three layer form in which the first layer is a carrier, the second layer is the underfill material, and the third layer is a release liner, in that order.

8. A method for producing a thinned semiconductor wafer with applied underfill, said method consisting of:
   (a) laminating a back grinding tape to the top of a semiconductor wafer with a plurality of metallic bumps on its top side and, optionally, through-silica-vias vertically through the silicon wafer, thereby covering the metallic bumps and through silicon vias, wherein the back grinding tape is disposed in contact with the metallic bumps;
   (b) thinning the back side of the wafer to form a thinned wafer;
   (c) mounting a dicing tape to the back side of the thinned wafer and mounting the silicon wafer and dicing tape to a dicing frame;
   (d) removing the back grinding tape;
   (e) aligning underfill material precut into the shape of the wafer with the thinned wafer and laminating the underfill to the thinned wafer;
   wherein prior to (e), no underfill is disposed in between the metallic bumps.

9. A method for producing a thinned semiconductor wafer with applied underfill, said method consisting of:
   (a) thinning the back side of a semiconductor wafer to produce a thinned wafer with a plurality of metallic bumps on its top side and, optionally, through-silica-vias vertically through the silicon wafer, wherein a back grinding tape has been laminated to the top of the semiconductor wafer, thereby covering the metallic bumps and through silicon vias, wherein the back grinding tape is disposed in contact with the metallic bumps;
   (b) mounting a dicing tape to the back side of the thinned wafer and mounting the silicon wafer and dicing tape to a dicing frame;
   (c) removing the back grinding tape;
   (d) aligning underfill material precut into the shape of the wafer with the thinned wafer and laminating the underfill to the thinned wafer;
   wherein prior to (d), no underfill is disposed in between the metallic bumps.

10. The method of claim 1 wherein the thinned wafer is continuously supported throughout the production process by the backgrinding tape, the dicing tape, or both.

11. The method of claim 8 wherein the thinned wafer is continuously supported throughout the production process by the backgrinding tape, the dicing tape, or both.

12. The method of claim 9 wherein the thinned wafer is continuously supported throughout the production process by the backgrinding tape, the dicing tape, or both.

* * * * *